(12) United States Patent
Lercel

(10) Patent No.: US 6,610,446 B2
(45) Date of Patent: Aug. 26, 2003

(54) INFORMATION STORAGE ON MASKS FOR MICROLITHOGRAPHIC TOOLS

(75) Inventor: Michael James Lercel, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/770,732

(22) Filed: Jan. 26, 2001

(65) Prior Publication Data

US 2002/0102470 A1 Aug. 1, 2002

(51) Int. Cl.⁷ .............................. G03F 9/00; G03C 5/00; G06F 17/50; G21K 5/00
(52) U.S. Cl. .................... 430/5; 378/35; 716/19; 430/296

(58) Field of Search ................ 430/5, 296; 716/19; 378/35

(56) References Cited

U.S. PATENT DOCUMENTS 6,040,095 A    3/2000   Enichen et al.
6,379,867 B1 * 4/2002   Mei et al. ............... 430/296

* cited by examiner

Primary Examiner—Mark F. Huff
Assistant Examiner—Saleha Mohamedulla
(74) Attorney, Agent, or Firm—McGinn & Gibb, PLLC; Richard M. Kotulak, Esq.

(57) ABSTRACT

A mask includes an in-situ information storage mechanism on the mask, which stores mask pattern data that is supplied to a microlithographic tool (e.g., an optical stepper). The advantages of using the invention include immediate availability of pattern data of a particular mask to the microlithographic tool for improved integrated circuit productivity.

15 Claims, 2 Drawing Sheets

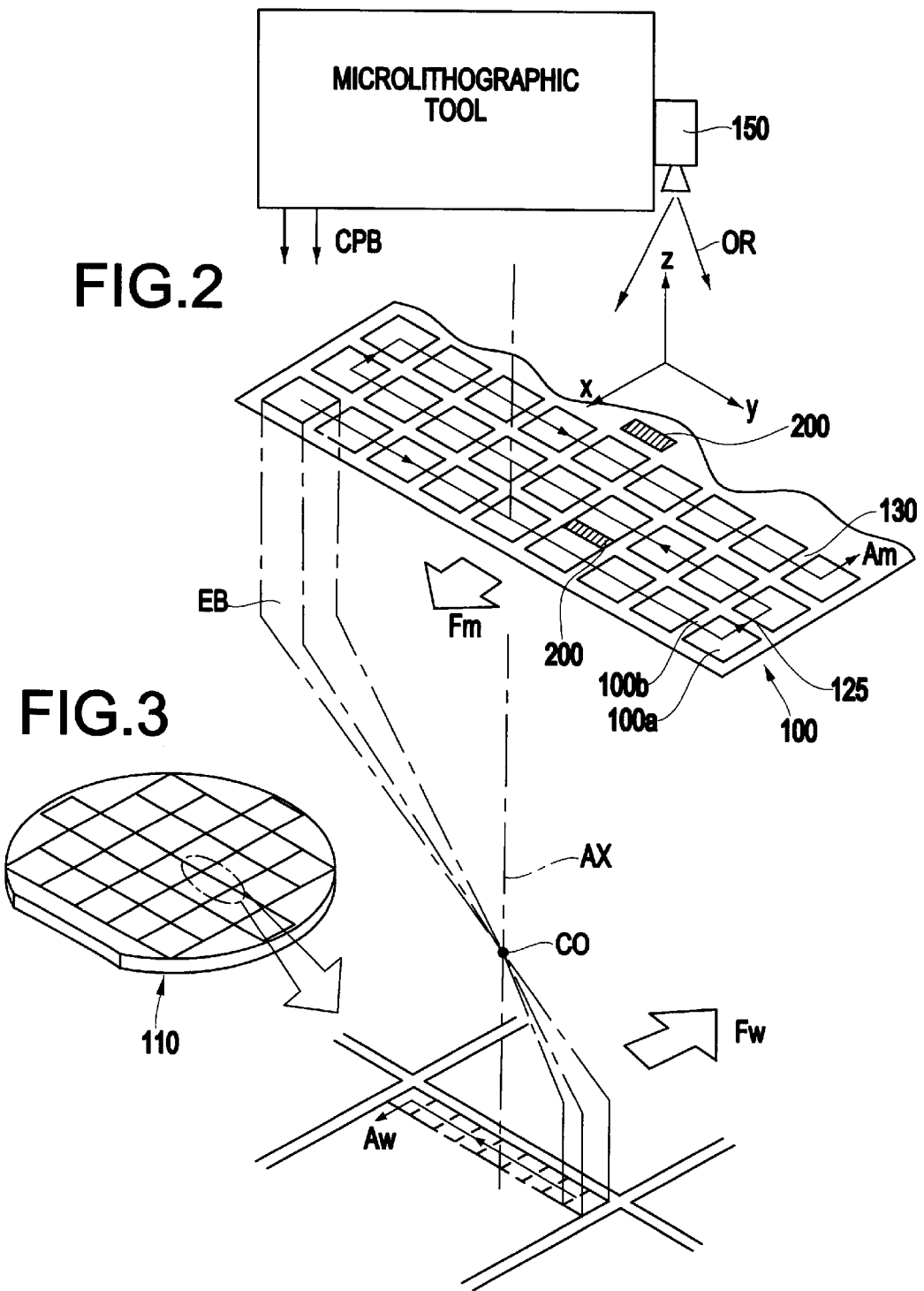

INFORMATION STORAGE ON MASKS FOR MICROLITHOGRAPHIC TOOLS

FEDERAL RESEARCH STATEMENT

This invention was made with United States Government support under Agreement No N00019-99-3-1366 awarded by the Naval Air Systems Command. The United States Government has certain rights in this invention.

BACKGROUND OF THE INVENTION

1. Field of the Invention

The present invention generally relates to masks (the term encompassing any of various types of masks and reticles) defining a pattern intended to be "transferred" (i.e., projection-exposed) onto a substrate that is sensitive to radiation (e.g., light or X-rays) or a charged-particle beam (e.g., an electron beam or ion beam) using microlithographic exposure tools.

2. Description of the Related Art

Semiconductor integrated circuit (IC) technology has advanced miniaturization and increased integration of semiconductor elements in IC devices by continued improvements provided by optical lithography techniques and tools.

Optical stepper tools and other projection-exposure tools typically use light for transferring the pattern from the mask to the substrate for imprinting integrated circuit patterns on semiconductor wafers and other substrates. Such tools use a projection-optical system to effect transfer of the mask pattern to the substrate. "Transfer tools" encompass any of the various projection-exposure systems operable to perform projection-imprinting (transfer) of a pattern defined by a mask onto a surface of a sensitive substrate. Transfer tools include steppers, scanners, and other lithographic exposure systems. Most transfer tools are "reducing" meaning that the image of the pattern formed on the substrate is smaller than a corresponding pattern on the mask.

With continued miniaturization of circuit patterns with attendant resolution limitations of light, much recent research and development in microlithography has been directed to transfer tools that use shorter-wavelength electromagnetic radiation (e.g., X-rays) or charged-particle beams ("CPBs," e.g., electron beams, ion beams) rather than visible or UV light.

In conventional microlithography exposure systems, information of the mask patterns must be supplied to the microlithography tool ("the stepper") during the exposure process. For example, using charged particle beam (CPB) systems that include electron beam projection lithography (EPL), pattern data such as pattern density and the within membrane placement of each sub-field membrane must be supplied to the microlithographic exposure tool. The pattern density is needed for focus adjustments and the center field location is needed to properly align the pattern. Known techniques include electronically providing this pattern data to the stepper over a network connection.

Patterning data typically is provided to the microlithographic tool (e.g., a stepper) by complex network control connections or by an operator manually via portable data storage media that is loaded into the stepper. Such pattern data transfer is subject to ambiguities associated with each mask (reticle) during processing and not reliable.

SUMMARY OF THE INVENTION

It is, therefore, an object of the present invention to provide a structure and method for associating pattern data with each mask without the need for added system support and attendant network connection(s) between the pattern data storage component(s) and the microlithographic tool.

The invention provides patterning data associated with each reticle, which physically resides directly on the reticle. This patterning data typically is provided to the microlithographic tool by complex network control connections or loaded manually from portable data storage media. The invention eliminates these intermediate network connections to the microlithographic tool, thereby improving IC productivity. Two preferred embodiments of the invention are provided wherein the pattern data is stored in the mask via a memory device built into the mask and physically encoding the pattern data on the surface of the mask.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

BRIEF DESCRIPTION OF THE DRAWINGS

The foregoing and other objects, aspects and advantages will be better understood from the following detailed description of preferred embodiments of the invention with reference to the drawings, in which:

FIGS. 2 and 3 schematically show a sequence by which the sub-fields of a mask are projection-exposed onto the surface of a sensitive substrate, wherein supporting strut members and peripheral regions include the encoded pattern data in markings.

DETAILED DESCRIPTION OF THE PREFERRED EMBODIMENT

Figure 1:
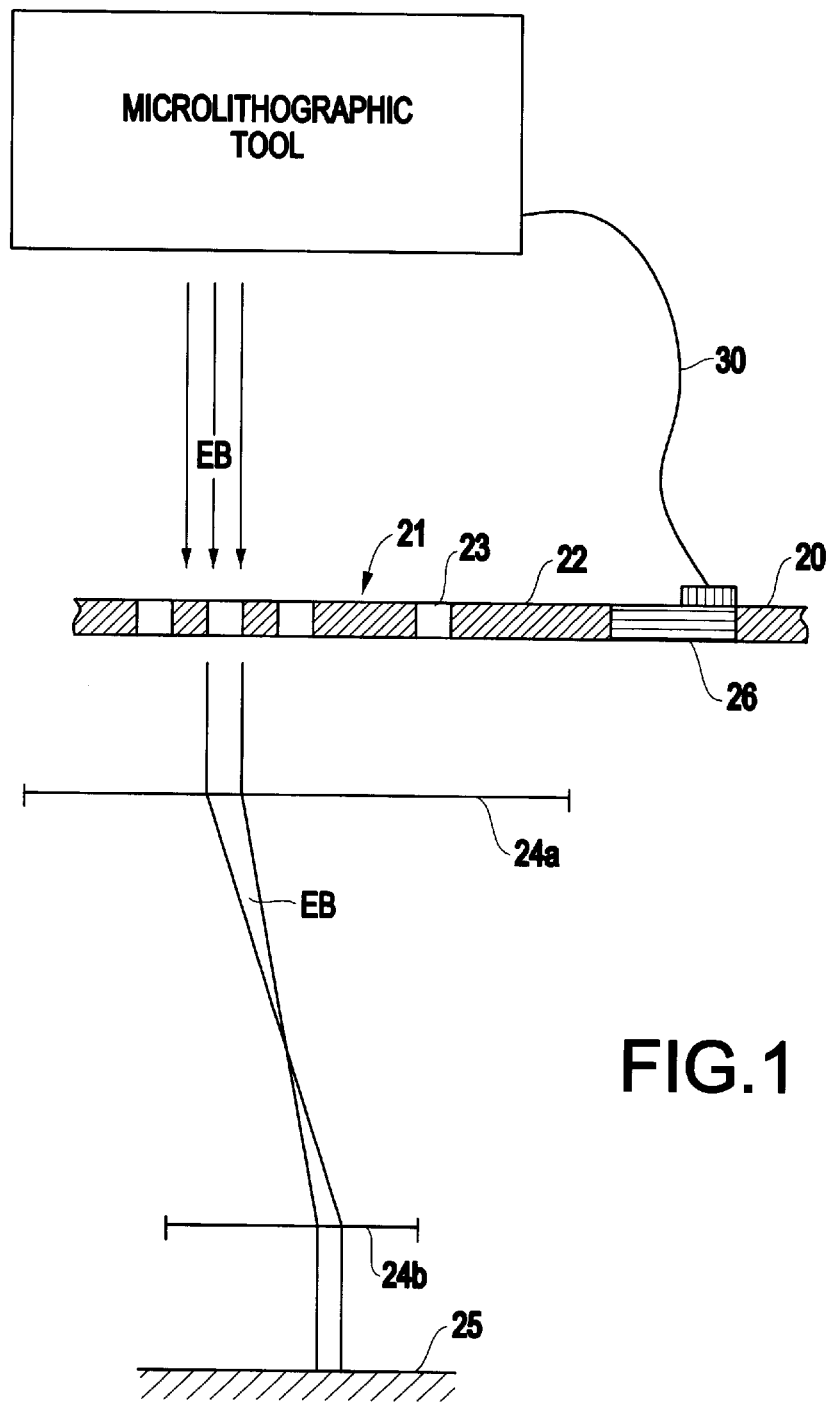
FIG. 1 shows, in a schematic exemplary elevational view, a mask for electron-beam reducing transfer using pattern data incorporated in the mask, and the path of an electron beam through the mask onto a surface of a substrate.

Referring now to FIG. 1, an exemplary stencil masks used in CPB reducing-transfer tools (specifically an electron-beam reducing transfer tool) is shown that incorporates a first embodiment of the invention. A mask 20 comprises a silicon mask substrate 22 that defines through-holes (voids) 23. The mask substrate 22 is sufficiently thick (e.g., 2 microns) to absorb or scatter sufficiently so that electrons irradiated onto the mask 21 in the opaque regions are not transmitted to the wafer. Some of the electrons in the beam EB pass through the voids 23 and are focused by a pair of projection lenses 24a, 24b onto a "sensitive" surface (e.g., a surface coated with a resists) of a suitable substrate (e.g., a silicon wafer). Thus, a pattern collectively defined by the array of voids 23 is transferred to the sensitive substrate 25. Such masks are conventionally termed "stencil" masks. An alternative mask for electrons consists of a continuous, thin membrane with a thin electron scattering layer patterned with the desired circuit layout (e.g., a SCALPEL mask, a registered trademark of Lucent Technologies). The continuous membrane mask functions to scatter the electrons in the same manner as the stencil mask. An embedded programmable memory device 26 is incorporated into the substrate 22 and is operably connected to the microlithographic tool through appropriate data transmission connection 30. The mask data contained in the programmable memory device 26 may be read into the exposure system either when the mask is initially loaded into the exposure tool or during the exposure process. The preferable sequence is the mask 20 is loaded into the exposure tool, the mask is aligned with the exposure tool mask stage, the mask data is read from the programmable memory device 26 (this step could occur simultaneously with the alignment step), and lastly the exposure begins utilizing the pattern density and location information from the programmable memory device 26.

The programmable memory device 26 is fabricated on the stencil mask 20 in an area not proximal to a membrane in the mask 20. The memory device 26 is an active memory device fabricated during reticle blank manufacture or during reticle manufacturing using well-known CMOS techniques. The charged particle beam mask 20 is typically fabricated from a silicon wafer substrate so that fabricating active CMOS devices on the substrate can occur using well known silicon processing techniques. The type of programmable memory device can be, but not limited to, a magnetic random access memory device, nonvolatile random access memory device, or other types of nonvolatile memory devices, wherein such forms of memory devices include programmable gate arrays. Pattern data such as pattern density and the within membrane placement of each sub-field membrane must be supplied to the microlithographic tool, which is stored in the memory device 26. Pattern density is needed for focus adjustments and the center field location is needed to properly align the pattern. In particular, the pattern density information is used to adjust the electron column parameters for the exposure of each sub-field membrane because the charge density during each exposure field requires adjustment of the electron column focus and aberration controls. The location of each membrane sub-field allows for the relaxation of the image placement requirements on the mask 20. Minor errors in the location of each sub-field can be corrected through electronic adjustments in EB deflection. The sub-field usage could also be encoded within the programmable memory array 26 such that if not all sub-fields were patterned on a particular mask, the exposure tool could skip the unnecessary sub-fields and decrease the time to print the particular pattern. An extension of the sub-field use could also incorporate multiple levels of a particular circuit design or multiple circuit designs on a single mask. The sub-fields needed to print a particular level is designated by encoding data contained in the programmable memory array 26.

FIGS. 2 and 3 show in perspective view a second embodiment of the invention wherein a mask 100 also used in an electron-beam reducing transfer tool wherein strut members 125 and 130 in a grill-type structure is shown. Stencil masks for CPB microlithography are typically divided into multiple sub-fields, each including a respective portion of the overall pattern defined by the mask. Each sub-field is separated from its neighboring sub-fields by intervening boundary regions. The boundary regions (struts) do not define any portion of the pattern. Rather, each boundary region typically has an underlying structural feature. The structural features collectively form a comparatively rigid lattice substructure for the mask that thermally and structurally supports the entire mask 100. In the second embodiment of the invention, pattern data of pattern density and location data is stored at various locations on the mask typically in either of these strut regions. This includes at least one patterned marking 200 that incorporates simple binary encoding (similar to UPC codes on packages) that can be etched directly into the silicon substrate of the reticle at the struts or in the surfaces away from the membranes. The pattern markings 200 can be a binary encoded marking that is located on the struts separating membrane fields of the stencil mask thereby placing pattern data directly adjacent to each membrane 100*a* of the stencil mask. There can be one or several depending on required pattern data for the mask.

In exemplary use, the pattern density and sub-field location offset are encoded for each sub-field on the mask. The pattern density in percentage can be encoded in 6-binary bits, and the location offset, in nanometers, can be encoded in an integer form with 16-bits for each of the three coordinates (x,y,z). These 54-binary bits would then be included, preferably, on the struts adjacent to each membrane. With a typical strut size of 0.2 mm by 1 mm, each bit is encoded as an optical scattering bar of width 100 microns that is etched into the silicon membrane. Alternatively, all the data for an entire row of sub-fields can be encoded at the start of a row. This pattern data is encoded and can be read by optical scanning device 150 that forms part of the microlithographic tool, which reads the markings 200 by scanning the mask 100 using OR beam and detecting the required information from the mask via light scattering or electron beam detection. Using this embodiment of the invention, the data contained into the markings 200 is read immediately before the exposure of each sub-field, although the data for the entire pattern can also be read before the exposure process begins.

In exemplary form, the mask 100 comprises a regular array of multiple sub-fields 100*a*. Each sub-field 100*a* contains a respective portion of the overall pattern defined by the mask 100 to be transferred to a sensitive substrate 110. The sub-fields 100*a* are separated from one another by boundary regions 100*b* that form a grid pattern across the mask 100. Strut supports 125 and 130 underlie respective boundary regions 100*b* of each sub-field 100*a* and provide a structural grid for the entire mask. The mask 100 comprises a mask membrane 20 that is transmissive to electrons. Applied to the upper surface of the mask membrane 20 within each sub-field 100*a* are regions of an electron-scattering material and spaces there between that define, in each sub-field 100*a*, the respective portion of the overall pattern defined by the mask.

A conventional electron-beam reducing transfer tool typically comprises a pair of projection lenses 24*a* and 24*b* (FIG. 1) for projecting the mask pattern onto a sensitive substrate 110. The apparatus also comprises a scatter aperture stop that transmits only those electrons passing through or near the crossover CO formed by the projection lens wherein AX is the normal axis for operation. The mask sub-fields 100*a* are sequentially "transferred" to the sensitive substrate 110 sub-field-by-sub-field in each row and row-by-row.

For example, as shown in FIG. 3, the sub-fields 100*a* are sequentially transferred by scanning the electron beam EB step-wise in the y-axis direction. After a row of sub-fields has been scanned, the mask 100 and substrate 110 are shifted in opposite directions along the x-axis, as shown by arrows Fm and Fw, respectively, to permit the next row of sub-fields to be transferred. (The sub-field scanning sequence and the sequence by which the substrate 110 is exposed are indicated by arrows Am and Aw, respectively.) Such sub-field-by-sub-field transfer is termed "divided transfer."

Loading of either embodiment of the mask (20, 100) in the micro-lithographic tool, the pattern data, as discussed above, is transferred to the tool from the stored data on the stencil mask (reticle) during reticle loading and alignment. When using the second embodiment of the invention, pattern data of pattern density and location data is stored at various locations on the mask. This encoded pattern data is read by optical techniques such as light scattering or by electron beam scanning by the microlithographic tool. The pattern data is then loaded into the exposure tool control software where the column settings (focus and aberration control) are determined from the pattern density and any required EB deflection corrections are determined for each sub-field. The optimal exposure order for the occupied sub-fields is then loaded into the exposure sequencing operation.

The invention preferably is used with stencil masks used in CPB lithographic applications, but can also be used with X-ray masks since they have similar structures as the continuous membrane type. Because x-rays and light are not easily deflected, the concepts discussed above are less useful for photons, but can be used to include pattern distortion or transparency information that can be corrected with optics or illumination settings or position offsets that can be corrected in stage position when used with x-ray, optical, and EUV exposures. The CPB mask has a substrate with defined voids therein that pass CPB, whereas regions of the substrate without voids block the CPB. Such a mask can include a mask membrane with regions thereon of a CPB scattering material, wherein the membrane passes the CPB and the scattering material blocks the CPB. In general, a stencil mask for X-ray lithography comprises a substrate that absorbs X-rays. The substrate defines voids therein that pass the X-ray beam, whereas regions of the substrate without voids blocks the X-ray beam. Such a mask can include a mask membrane with regions thereon of an X-ray scattering material, wherein the membrane passes the X-ray beam and the scattering material blocks the X-ray beam.

While the invention has been described in terms of preferred embodiments, those skilled in the art will recognize that the invention can be practiced with modification within the spirit and scope of the appended claims.

What is claimed is:

1. A mask for use in microlithography, said mask comprising:
    membrane portions;
    support portions connected to said membrane portions; and
    a data storage element encoded with pattern information, said element located on said support portions.

2. The mask of claim 1, wherein said mask is formed of silicon and said element comprises an active programmable memory cell with an external signal connection configured to operably connect to a microlithographic tool.

3. The mask of claim 1, wherein said data storage element comprises magnetic random access memory device.

4. The mask of claim 1, wherein said data storage element comprises nonvolatile random access memory device.

5. The mask of claim 1, wherein said data storage element comprises a nonvolatile memory device.

6. A mask for use in microlithography, said mask comprising:
    membrane portions;
    support portions connected to said membrane portions; and
    a data storage element encoded with pattern information, said element located on said support portions,
    wherein said pattern information includes pattern density and membrane placement of each sub-field of said membrane.

7. The mask of claim 2, wherein said microlithographic tool comprises an electron beam projection lithography tool.

8. The mask of claim 1, wherein said mask comprises a stencil mask.

9. The mask of claim 1, wherein said mask comprises a continuous membrane mask.

10. A mask for use in microlithography, said mask comprising:
    a plurality of patterned sub-field membrane mask areas,
    struts extending between and supporting said membrane mask areas, and
    at least one pattern marking of encoded information located on said struts adjacent to said sub-field membrane mask areas.

11. A mask for use in microlithography, said mask comprising:
    a plurality of patterned sub-field membrane mask areas,
    struts extending between and supporting said membrane mask areas, and
    at least one pattern marking of encoded information located on said struts adjacent to said sub-field membrane mask areas,
    wherein said at least one pattern marking is etched into a planar surface of said struts.

12. A mask for use in microlithography, said mask comprising:
    a plurality of patterned sub-field membrane mask areas,
    struts extending between and supporting said membrane mask areas, and
    at least one pattern marking of encoded information located on said struts adjacent to said sub-field membrane mask areas,
    wherein said encoded information includes pattern density and membrane placement of each sub-field membrane.

13. A mask for use in microlithography, said mask comprising:
    a plurality of patterned sub-field membrane mask areas,
    struts extending between and supporting said membrane mask areas, and
    at least one pattern marking of encoded information located on said struts adjacent to said sub-field membrane mask areas,
    wherein said encoded information drives a microlithographic tool that comprises an electron beam (EB) projection lithography tool and said mask is scanned by said EB lithography tool for pattern data from said at least one pattern marking.

14. The mask of claim 10, wherein said mask comprises a stencil mask.

15. The mask of claim 10, wherein said mask comprises a continuous membrane mask.

* * * * *